United States Patent
Lan et al.

(10) Patent No.: US 7,344,598 B2
(45) Date of Patent: Mar. 18, 2008

(54) ROTATIONALLY-VIBRATED UNIDIRECTIONAL SOLIDIFICATION CRYSTAL GROWTH SYSTEM AND ITS METHOD

(75) Inventors: Chune-Wen Lan, Sindian (TW); Wan-Chin Yu, Sindian (TW)

(73) Assignee: National Taiwan University (TW)

( * ) Notice: Subject to any disclaimer, the term of this patent is extended or adjusted under 35 U.S.C. 154(b) by 492 days.

(21) Appl. No.: 10/941,497

(22) Filed: Sep. 15, 2004

(65) Prior Publication Data

US 2006/0054081 A1 Mar. 16, 2006

(51) Int. Cl.
*C30B 11/02* (2006.01)
(52) U.S. Cl. .......................... 117/221; 117/82; 117/83; 117/84
(58) Field of Classification Search .............. 117/82, 117/83, 84, 221
See application file for complete search history.

(56) References Cited

U.S. PATENT DOCUMENTS

| 6,645,294 B2 | 11/2003 | Lan et al. |
| 2003/0089301 A1* | 5/2003 | Kishida et al. ............... 117/13 |
| 2003/0131789 A1* | 7/2003 | Amemiya .................... 117/200 |

\* cited by examiner

*Primary Examiner*—Robert Kunemund
(74) *Attorney, Agent, or Firm*—Schmeiser, Olsen & Watts

(57) ABSTRACT

A rotationally-vibrated unidirectional solidification crystal growth system comprises a furnace, a crucible, a rotational-vibration device including a mounting holder, a motor and a vibrating apparatus. The furnace contains a high temperature portion, a thermal isolation portion and a low temperature portion. The crucible connected to the rotational-vibration device within the furnace has a seed well down to a crystal growth arena. The crystal is grown as the ambient temperature profile moving from high to low, which can be achieved through a relative movement between the furnace and the crucible. That is either the furnace or the crucible is undergoing a top-down movement. The rotational-vibration device offers the crucible the required rotation and angular vibration, with a vibrating frequency no less than 0.2 Hz.

14 Claims, 4 Drawing Sheets

| providing a furnace having a crucible therein, and the crucible contains a seed and a raw material: since the crucible contains a seed well and a crystal growth arena, the seed and the crystal growth arena can accommodate the raw material and the doping distributed in the raw material; the present invention adopts the semiconductor gallium phosphide of Element Groups III-V for the raw material and silicon for the doping. | S1 |
|---|---|

↓

| using the furnace to heat the crucible and melt the raw material as to achieve the even blending effect: since the furnace contains a high temperature portion for providing a high temperature status and the high temperature status provides a temperature higher than the melting point of the raw material, the raw material can be melted; since gallium phosphide is used as the raw material in the invention, the crucible must be heated to a temperature over 1465°C to melt the gallium phosphide | S2 |
|---|---|

↓

| providing a rotational vibrating apparatus for rotating and vibrating the crucible and using the furnace to cool the crucible: the rotational vibrating apparatus is disposed either above or under the crucible to work together with a bearing and a crucible axle; the rotational vibrating apparatus and the crucible substantially, coaxially and simultaneously rotate and vibrate for achieving the stable effect for the rotation and vibration and the rotational vibrating apparatus vibrates with a vibrating frequency no less than 0.2Hz, and the amplitude of the vibration can be adjusted as needed. On the other hand, since the crucible can move vertically up and down, the crucible in the furnace can rotate and vibrate from the high temperature portion to the low temperature portion. The low temperature portion provides a low temperature status for providing a temperature lower than the melting point of the raw material, so that the seed in the seed well can be used to crystallize the raw material. | S3 |
|---|---|

Fig. 4

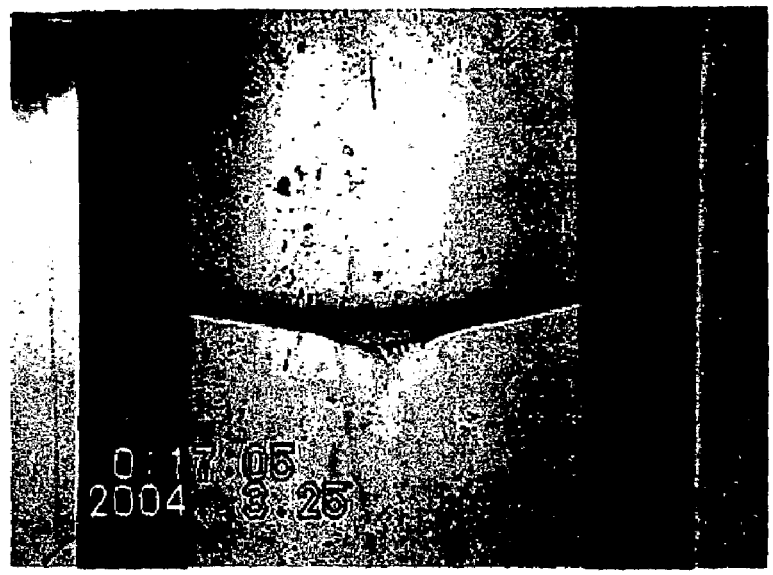
Attachment 1
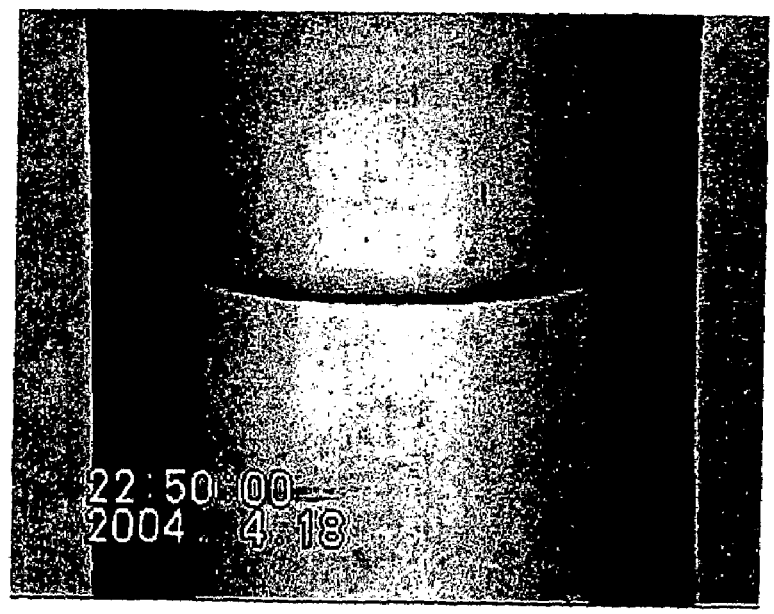
Attachment 2

ROTATIONALLY-VIBRATED UNIDIRECTIONAL SOLIDIFICATION CRYSTAL GROWTH SYSTEM AND ITS METHOD

FIELD OF THE INVENTION

The present invention relates to a rotationally-vibrated unidirectional solidification crystal growth system and its method, more particularly to a crystal growth system and its method using a vibration frequency not less than 0.2 Hz for the vibration with even heating as to improve the crystal quality and enhance the growth interface stability.

BACKGROUND OF THE INVENTION

In the field of single crystal manufacturing technology, the materials for growing crystals include semiconductors, organic matter, inorganic matter (oxides), metals and superconductors, etc. The current methods for growing these crystals mainly include Czochralski method, Bridgman method and a gradient freeze method that is very similar to Bridgman method.

In general, the yield of Czochralski method is higher than that of gradient freeze method, but the number of defects caused by the thermal stress in the Czochralski method is larger. Therefore, it is more popular to use the Bridgman method and the gradient freeze method to grow compound crystals in addition to the silicon single crystals in recent years.

As to the Bridgman method and the gradient freeze method, the differences reside in that the Bridgman method moves a crucible in a furnace having a high temperature portion and a low temperature portion to change the melting temperature inside the crucible, and the gradient freeze method moves the crucible to change the melting temperature inside the crucible. Whether the Bridgman method or the gradient freeze method, a stable ambient temperature is provided for steadily growing single crystals regardless, and thus a more appropriate crystal growth condition is provided for manufacturing crystals with higher quality and less defects. However, the latent heat of solidification will be released in a crystal growth process. FIG. 1 shows the interface between the melting state and solid state of the single crystal growth according to the prior art. The interface 13 between the solid-state single crystal 11 and melting state 12 is usually depressed; wherein the melting state 12 could be for any of the foregoing single crystal growing materials, and the convective flow caused by gravitational force will create a doping 14 in the melting state 12 which is distributed and centralized at the center of the interface 13. In other words, an axial segregation and the radial segregation of the doping 14 are created and thus cause an excessively cold interface 13 or an interface breakdown. The direction of the gravitational force is indicated by Arrow G, and the direction of the convective flow is indicated by Arrow C. As described above, even though the heat transfer can be precisely controlled in the crystal growth process, it is still unable to eliminate the convective flow in the melting state. Therefore, the crystal so grown will be defective, and it is necessary to reduce the axial segregation and radial segregation in order to effectively control the distribution of the doping in the axial and radial directions. It is very important to effectively control the convective flow.

In the prior art, a magnetic field is added to reduce some of the accumulated doping in order to effectively reduce the impact of convective flow to the crystal growth. However, such arrangement not only makes the manufacturing difficult and the cost high, but also cannot effectively provide a magnetic field to the crystal growing area to control the crystal growth, and thus the method can only be applied for the solution being used as an electric conductor.

Please refer to FIG. 2 for the illustrative view of the prior-art centrifugal crystal growth system. In recent years, a centrifugal method has been developed to reduce some of the convective flow and further improve the axial segregation. This method uses a large centrifuge 21 to produce a centrifugal force on a crucible 22. In most cases, a free-swing rotation is adopted for such operation. In other words, the direction of the composite acceleration of the centrifugal force and the gravitational fore is parallel to the axis of the crucible. However, the aforementioned operation method has not fully used the centrifugal force and the Coriolis force, and will cause a three-dimensional flow of the melting state 23 and increase the axial segregation of the doping 24. A coaxial rotation can be used to achieve the same effect. Further, the accelerated crucible rotation technique (ACRT) is used by changing rotation speed, and an Eckman flow near the interface and a Taylor flow along the ampoule wall are added and mixed to produce a long-cycle unstable growth and impurity fluctuated distribution. To effectively form the Eckman (convective) layer, the cycle for the change of rotation is long and usually falls in the range from several seconds to several minutes.

In the R.O.C. Patent Publication No. 500839 entitled "rational directional solidification crystal growth system and method", a furnace, a crucible and a rational mounting device are disclosed. The rational mounting device holds and rotates the crucible, and the tangential speed of the rotation of the crucible is not less than $5\pi/3$ cm/sec. Therefore, it is known that the rational mounting device rotates the crucible in hope of providing a certain centrifugal force perpendicular to the gravitational force to the raw materials and the doping therein and further to eliminate the recession disposed at the center of the interface due to the accumulated doping and enhance the interface stability. That invention also produces a convective flow in the opposite direction of the natural convective flow to eliminate the natural convective flow in order to improve the doping distribution (both in the axial and radial directions) and the single crystal quality. However, a simple rotation in one direction really cannot meet the desired efficiency. Therefore, an effective way of reducing the convective flow phenomenon (which also reduces the axial segregation) and eliminating the central recession and breakdown at the center of the interface as to reduce the axial segregation and the radial segregation and further to avoid the excessively cold interface and the interface breakdown is a subject that deserves immediate attention.

SUMMARY OF THE INVENTION

The primary objective of the present invention is to provide a rotationally-vibrated unidirectional solidification crystal growth system and method to resist the natural convective flow produced by the gravitational force in order to improve the doping distribution and the crystal quality.

Another objective of the present invention is to provide a rotationally-vibrated unidirectional solidification crystal growth system and method to eliminate the recession disposed at the center of an interface caused by the accumulation of a solute or a doping and enhance the interface stability.

A rotationally-vibrated unidirectional solidification crystal growth system in accordance with the present invention comprises: a furnace, being vertically disposed for providing different ambient temperatures; a crucible, being disposed in the furnace and vertically aligned together with the axis of the furnace; and a rotational vibrating apparatus, including a mounting holder, a motor and a vibrating apparatus and being coupled to the crucible for vibrating the crucible; wherein the furnace further contains a high temperature portion, a thermal isolation portion and a low temperature portion. The high temperature portion provides a high temperature status; the low temperature portion provides a low temperature status; and the high temperature status provides a temperature higher than the melting point of a raw material for performing a heating process and the low temperature status provides a temperature lower than the melting point of a raw material for performing a crystallization process, and thus the present invention can provide different ambient temperature for performing different processes.

A rotationally-vibrated unidirectional solidification crystal growth method in accordance with the present invention comprises the steps of: (S1) providing a furnace having a crucible therein, and the crucible contains a seed and a raw material; (S2) using the furnace to heat the crucible and melt the raw material as to achieve the even blending effect; and (S3) providing a rotational vibrating apparatus for angularly vibrating the crucible and using the furnace to cool the crucible.

It is noteworthy that the person skilled in the art may rotate the crucible at a low speed in a prior-art crystal growth system and method as to increase the evenness of heating the crucible, and also stop rotating the crucible and then rotating the crucible in an opposite direction as to improve the mixing. Such method is called the accelerated crucible rotation technique (ACRT), which is significantly different from the present invention. In other words, the frequency of rotating the crucible or changing the rotational direction according to the prior art is very low (far lower than 0.2 Hz) and its objective is to increase the evenness of heating the crucible and mixing with the impurities, which is significantly different from the objective of the present invention. Further, the frequency of rotating the crucible or changing the rotational direction is far smaller than 0.2 Hz claimed in the present invention.

Since the rotationally-vibrated unidirectional solidification crystal growth method in accordance with the present invention uses a frequency higher than 0.2 Hz to vibrate the raw materials and their doping alternatively in clockwise and counterclockwise rotational directions in the crystal growth process, therefore the present invention can provide sufficient resistance for the Stokes flow at the interface in order to resist the uneven convective flow caused by the gravitational force to the raw materials and their doping and further eliminate the recession disposed at the center of the interface due to the accumulated doping and enhance the interface stability. The present invention also produces a streaming flow that flows in a direction opposite to the natural convective flow for eliminating the natural convective flow and enhancing the doping distribution (in both axial and radial directions) and the crystal quality.

To make it easier for our examiner to understand the objective of the invention, its structure, innovative features, and performance, we use a preferred embodiment together with the attached drawings for the detailed description of the invention.

BRIEF DESCRIPTION OF THE DRAWINGS

FIG. 4 is a rotationally-vibrated unidirectional solidification crystal growth method according to a preferred embodiment of the present invention.

Attachments 1 and 2 are two photographs of the laboratory for carrying out the embodiment of the present invention.

DETAILED DESCRIPTION OF THE PREFERRED EMBODIMENTS

The detailed description and technical characteristics of the present invention are described together with the drawings as follows.

Figure 3:
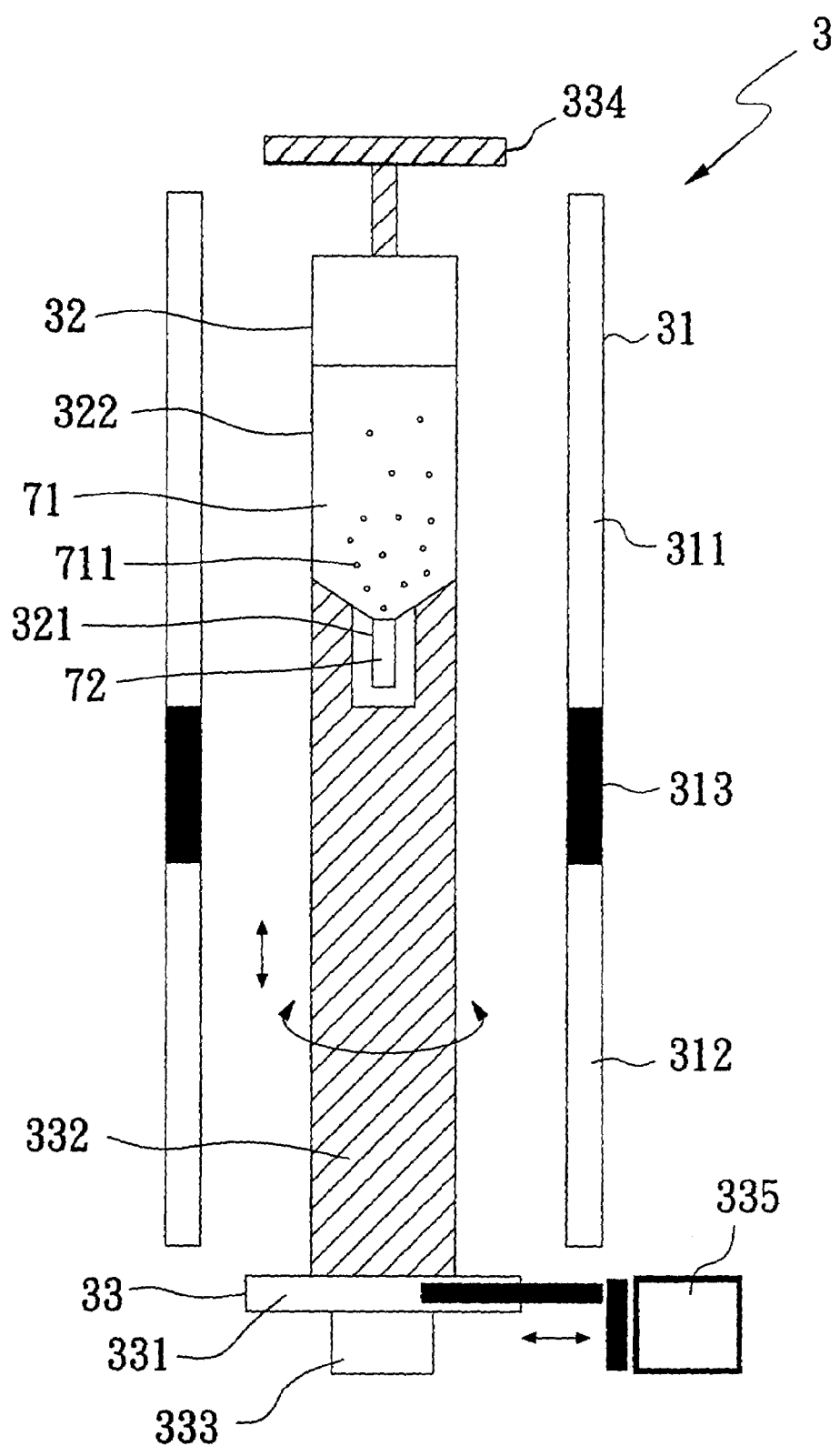
FIG. 3 is a rotationally-vibrated unidirectional solidification crystal growth system according to a preferred embodiment of the present invention.

Please refer to FIG. 3 for an illustrative view of a rotationally-vibrated unidirectional solidification crystal growth system according to a preferred embodiment of the present invention. A rotationally-vibrated unidirectional solidification crystal growth system 3 comprises: a furnace 31, being vertically disposed for providing different ambient temperatures; a crucible 32, being disposed in the furnace 31 and vertically aligned with the same axis of the furnace 31; and a rotational vibrating apparatus 33, including a mounting holder 331, a motor 333 and a rotational vibrating apparatus 335 and being coupled to the crucible 32 for vibrating the crucible 32; wherein the furnace 31 further contains a high temperature portion 311, a thermal isolation portion 313 and a low temperature portion 312. The high temperature portion 311 provides a high temperature status; the low temperature 312 portion provides a low temperature status; and the high temperature status provides a temperature higher than the melting point of a raw material for performing a heating process and the low temperature status provides a temperature lower than the melting point of a raw material for performing a crystallization process, and thus the present invention can provide different ambient temperatures for performing different processes. The thermal isolation portion 313 is disposed between a high temperature portion 311 and the low temperature portion 312 for isolating the temperature different between the high temperature portion 311 and the low temperature portion 312 of the furnace 31. The crucible 32 has a seed well 321 and a crystal growth arena 322, and the seed well 321 accommodates a seed 72 and the crystal growth arena 322 accommodates a raw material 71 and a doping 711 distributed in the raw material 71. The raw material 71 could be an organic matter, an oxide, a superconductor, a metal or a semiconductor, such as Benzil (an organic matter), $LiNbO_3$ (an oxide), PZNT (a piezoelectric material), $Yba_2Cu_3O_{6+x}$ (a superconductor), aluminum (a metal), gallium phosphide (GaP), gallium arsenide (GaAs), silicon germanium compound ($Si_xGe_{1-x}$), and cadmium telluride (CdTe) (semiconductors) which is applicable to this invention. The crucible 32 further contains a crucible axle 332 working together with the rotational vibrating apparatus 33 for achieving the stable effect for the rotation and vibration. More precisely speaking, the rotational vibrating apparatus 33 and the crucible 32 substantially, coaxially and simultaneously rotate and vibrate. The present invention further comprises a bearing 334 disposed at an end of the crucible 32 for facilitating the rotation and vibration in the furnace, and the rotational vibrating apparatus 33 vibrates with a vibrating frequency no less than 0.2 Hz, and the amplitude of the vibration can be adjusted as needed. In the figure, the crucible 32 moves vertically up and down as to rotate and vibrate the crucible 32 in the furnace 31 from the high temperature portion to the low temperature portion. Therefore, a movement in the opposite direction with the thermal convective flow is produced by the heating in the high temperature portion 311 to resist the natural convective flow produced by the gravitational force, improve the doping distribution, eliminate the recession disposed at the center of the interface caused by the accumulation of solutes or impurities, and enhance the interface stability. After the movement, the cooling of the low temperature portion 312 is used to carry out the crystal growth process with the seed 72 in the seed well 321. Therefore, this embodiment further comprises a motor (not shown in the figure) and a linear sliding track (not shown in the figure) for driving and controlling the crucible 32 to move vertically up and down. In another embodiment, the furnace 31 can move vertically to rotate and vibrate the crucible 32 in the furnace 31 and move the crucible 32 from the high temperature portion 311 to the low temperature portion 312. Similarly, the foregoing heating, melting, cooling, and crystallization processes are performed. Please refer to FIG. 3 for the rotational vibrating apparatus 33 being disposed under the crucible 32 according to this embodiment. Alternatively, the rotational vibrating apparatus 33 could be disposed above the crucible 32 or some other places.

All doping 711 corresponding to the foregoing raw material 71 such as neodymium in benzyl; magnesium oxide (MgO) or iron in lithium niobate ($LiNbO_3$), silicon or selenium in gallium arsenide; and phosphorus in cadmium telluride. It is noteworthy that the yttrium-barium-copper oxides and the silicon germanium compounds use different combination of elements as the doping, such as the yttrium-barium-copper oxide ($Yba_2Cu_3O_6$) containing 6 oxygen atoms and the yttrium-barium-copper oxide ($Yba_2Cu_3O_7$) containing 7 oxygen atoms. Further, mole-mass ratio of the lithium niobate ($LiNbO_3$) or the lithium tantalate ($LiTaO_3$) is 1:1 for the crystal growth.

Taking semiconductors for example, if the raw material 71 is a semiconductor of gallium belonging to the element group IIIA and arsenic belonging to the element group VA, then the high temperature portion 311 must provide a temperature higher than the melting point of the gallium arsenide (GaAs) and the low temperature portion provides a temperature lower than the melting point of the gallium arsenide (GaAs).

Please refer to Attachments 1 and 2 for two pictures of the laboratory demonstrating the use of this invention, which show the succinonitrile being added to a small quantity of acetone to serve as a doping for the crystal growth, and the crystal growth rate is 2.5 μm/s. Attachment 1 shows the crystal growth result without rotating and vibrating the crucible and Attachment 1 shows the crystal growth result by rotating the crucible 32 at a vibrating frequency of 60 Hz (angular vibration of approximately 0.06 radian). From Attachments 1 and 2, it is obvious that if the crucible 32 is not rotated or vibrated, the acetone will accumulate at the center of the interface, and thus will expedite the occurrence of interface breakdown. If the crucible 32 is rotated and vibrated, then the interface breakdown will not occur.

Please refer to FIG. 4 for the procedure of the rotationally vibrated unidirectional solidification crystal growth method, which comprises the steps of:

(S1): providing a furnace having a crucible therein, and the crucible contains a seed and a raw material: since the crucible contains a seed well and a crystal growth arena, therefore the seed well can accommodate the seed and the crystal growth arena can accommodate the raw material and the doping distributed in the raw material; the present invention adopts the semiconductor gallium phosphide of Element Group III-V for the raw material and silicon for the doping;

(S2): using the furnace to heat the crucible and melt the raw material as to achieve the even blending effect; since the furnace contains a high temperature portion for providing a high temperature status and the high temperature status provides a temperature higher than the melting point of the raw material, and thus the raw material can be melted; since gallium phosphide is used as the raw material in the invention, therefore the crucible must be heated to a temperature over 1465° C. to melt the gallium phosphide; and (S3) providing a rotational vibrating apparatus for rotating and vibrating the crucible and using the furnace to cool the crucible: the rotational vibrating apparatus is disposed either above or under the crucible to work together with a bearing and a crucible axle; the rotational vibrating apparatus and the crucible substantially, coaxially and simultaneously rotate and vibrate for achieving the stable effect for the rotation and vibration and the rotational vibrating apparatus vibrates with a vibrating frequency no less than 0.2 Hz, and the amplitude of the vibration can be adjusted as needed. On the other hand, since the crucible can move vertically up and down, the crucible in the furnace can rotate and vibrate from the high temperature portion to the low temperature portion. The low temperature portion provides a low temperature status for providing a temperature lower than the melting point of the raw material, so that the seed in the seed well can be used to crystallize the raw material, and the furnace further comprises a thermal isolating portion disposed between the high temperature portion and the low temp portion for isolating the temperature difference between the high temperature portion and the low temperature portion, so that the crystallized raw material will not be affected by the heating portion. In another embodiment, the furnace moves vertically to facilitate the crucible to rotate and vibrate in the furnace and move from the high temperature portion to the low temperature portion. Since the raw material used in this invention is gallium phosphide, therefore it is necessary to cool the crucible to a temperature below 1465° C. to solidify the gallium phosphide.

The raw material adopted in this invention could be an organic matter, an oxide, a superconductor, a metal or a semiconductor, such as Benzil (an organic matter), $LiNbO_3$ (an oxide), PZNT (a piezoelectric material), $Yba_2Cu_3O_{6+x}$ (a superconductor), aluminum (a metal), gallium phosphide (GaP), gallium arsenide (GaAs), silicon germanium compound ($Si_xGe_{1-x}$), and cadmium telluride (CdTe) (semiconductors). Therefore this invention can be applied extensively in the semiconductor and related industries.

Figure 1:
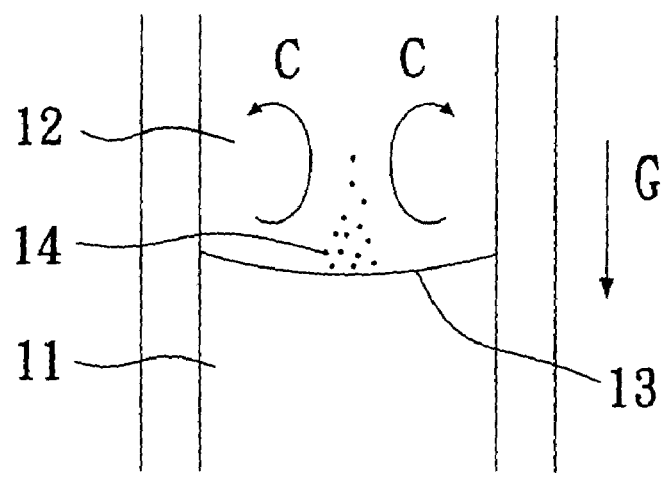
FIG. 1 is an illustrative view of the interface of the melting sate and the solid state according to a prior crystal growth system.
Figure 2:
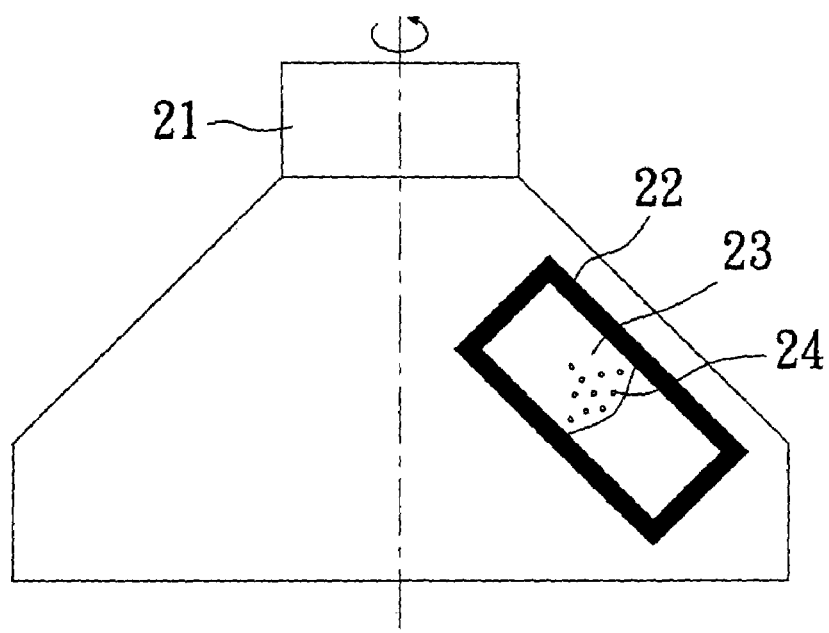
FIG. 2 is an illustrative view of a prior centrifugal crystal growth system.

In summation of the description above, since the rotationally-vibrated unidirectional solidification crystal growth system and the method according to the present invention adopt a vibrating frequency no less than 0.2 Hz to rotate and vibrate the crucible in a crystal growth process, a sufficient streaming flow (Stokes flow) at the interface to the raw material in the crucible can be achieved. Therefore, the raw material will produces a flow in the direction opposite to that of the natural convective flow as indicated by Arrow C in FIG. 1. As a result, the present invention can eliminate the recession at the center of the interface caused by the doping and the natural convective flow as well as reduce the axial and radial segregations of the reactant as to avoid an excessively cold assembly caused by the partially accumulated doping and interface breakdown.

The foregoing embodiments are used for examples only and not intended for being a limitation. For example, the temperature of the finance can be changed according to the gradient freeze method or the Bridgman method, and the temperature distribution of the furnace can be changed by multi-sectional heating, and the rotational vibrating apparatus can just rotate and vibrate the crucible. It is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A rotationally-vibrated unidirectional solidification crystal growth system, comprising:
   a furnace, for providing different ambient temperatures;
   a crucible, being disposed in said furnace; and
   a rotational vibrating apparatus, being coupled with said crucible for rotating and vibrating said crucible alternatively in clockwise and counterclockwise directions.

2. The rotationally-vibrated unidirectional solidification crystal growth system of claim 1, wherein said furnace further comprises a high temperature portion and a low temperature portion, and said high temperature portion provides a high temperature status and said low temperature portion provides a low temperature status, and said high temperature status provides a temperature higher than the melting point of a raw material, and said low temperature status provides a temperature lower than the melting point of said raw material, and thus providing a different ambient temperature.

3. The rotationally-vibrated unidirectional solidification crystal growth system of claim 1, wherein said crucible comprises a seed well and a crystal growth arena, and said seed well is capable of accommodating a seed, and said crystal growth arena is capable of accommodating a raw material and a doping distributed in said raw material.

4. The rotationally-vibrated unidirectional solidification crystal growth system of claim 1, wherein said crucible further comprises a crucible axle working with said rotational vibrating apparatus for achieving a stable rotation and vibration effect.

5. The rotationally-vibrated unidirectional solidification crystal growth system of claim 1, wherein the system further comprises at least one bearing disposed at an end of said crucible for vibrating said crucible substantially in the rotation direction in said furnace.

6. The rotationally-vibrated unidirectional solidification crystal growth system of claim 1, wherein said rotational vibrating apparatus has a vibrating frequency no less than 0.2 Hertz.

7. The rotationally-vibrated unidirectional solidification crystal growth system of claim 2, wherein said furnace further comprises a thermal isolating portion being disposed between said high temperature portion and said low temperature portion for isolating a temperature difference between said high temperature portion and said low temperature portion.

8. The rotationally-vibrated unidirectional solidification crystal growth system of claim 2, wherein said crucible is capable of moving vertically for facilitating said crucible to rotate and vibrate from said high temperature portion to said low temperature portion in said furnace.

9. The rotationally-vibrated unidirectional solidification crystal growth system of claim 2, wherein said furnace is capable of moving vertically for facilitating said crucible to rotate and vibrate from said high temperature portion to said low temperature portion in said furnace.

10. The rotationally-vibrated unidirectional solidification crystal growth system of claim 2, wherein said raw material is one selected from the collection of an organic matter, an oxide, a superconductor, a metal and a semiconductor.

11. The rotationally-vibrated unidirectional solidification crystal growth system of claim 3, wherein said raw material is one selected from the collection of an organic matter, an oxide, a superconductor, a metal and a semiconductor.

12. The rotationally-vibrated unidirectional solidification crystal growth system of claim 1, wherein said rotational vibrating apparatus is disposed above said crucible.

13. The rotationally-vibrated unidirectional solidification crystal growth system of claim 1, wherein said rotational vibrating apparatus is disposed below said crucible.

14. The rotationally-vibrated unidirectional solidification crystal growth system of claim 1, wherein said crucible is disposed in said furnace.

* * * * *